United States Patent [19]

Byeon

[11] Patent Number: 5,305,524

[45] Date of Patent: Apr. 26, 1994

[54] METHOD FOR CONTROLLING DIFFERENT COMPONENT INSERTING SYSTEM

[75] Inventor: Sang-Du Byeon, Suwon, Rep. of Korea

[73] Assignee: Samsung Electronics Co., Ltd., Suwon, Rep. of Korea

[21] Appl. No.: 929,575

[22] Filed: Aug. 14, 1992

[30] Foreign Application Priority Data

Aug. 17, 1991 [KR] Rep. of Korea .................... 91-14205

[51] Int. Cl.$^5$ ............................................. H05K 3/32
[52] U.S. Cl. ........................................ 29/836; 29/837
[58] Field of Search ................. 29/739, 740, 741, 834, 29/836, 837

[56] References Cited

U.S. PATENT DOCUMENTS

| 4,450,619 | 5/1984 | Wright et al. | 29/741 X |
| 4,621,419 | 11/1986 | Hino et al. | 29/837 |
| 4,705,081 | 11/1987 | Birk et al. | 29/837 X |
| 4,759,112 | 7/1988 | McLean et al. | 29/741 X |
| 4,944,086 | 7/1990 | Nishihara et al. | 29/837 |

FOREIGN PATENT DOCUMENTS

| 2256300 | 10/1990 | Japan | 29/837 |
| 4026200 | 1/1992 | Japan | 29/837 |

Primary Examiner—Peter Dungba Vo
Attorney, Agent, or Firm—Burns, Doane, Swecker & Mathis

[57] ABSTRACT

A method for controlling a different component inserting system controls a component inserting operation by turning ON/OFF each selection switch necessary to select a component feeder of the different component inserting system needed for factory automation.

4 Claims, 4 Drawing Sheets

METHOD FOR CONTROLLING DIFFERENT COMPONENT INSERTING SYSTEM

BACKGROUND OF THE INVENTION

1. Field of the Invention

The present invention relates to a method for controlling a different component inserting system which can control a component inserting operation by turning ON/OFF each selection switch necessary to select a component feeder of the different component inserting system needed factory automation.

2. Description of the Prior Art

In general, an electronic component feeder of a different component inserting system includes a feeder 2 for supplying electronic components 1 stored in a stack, a rodless cylinder 4 generally secured on the lower side of the feeder 2 for reciprocating a carrier member 3 in a right and left direction, and a feeding member 5 disposed on the carrier member 3 of the rodless cylinder 4 for feeding the electronic components 1 in cooperating relationship with the reciprocating movement of the carrier member 3. With the different component inserting system, the electronic components 1 supplied by the feeder 2 are inserted into predetermined positions on a printed circuit board (PCB substrate).

For example, the electronic component inserting system embodied with such a different component inserting system is disclosed in for example, U.S. Pat. No. 4,450,619. According to this system, two positioning pins of each magazine operate a corresponding switch to indicate a central spacing of the components preserved in the magazine to a computer control system in order to appropriately match other components of the component inserting system.

With the construction proposed in the patent, when at least one kind of board component is continually inserted in the printed circuit board, bad components are likely to be inserted to the PCB substrate. In this case, means for removing the bad components is not provided in the system, so bad components must be manually removed by the user. As a result, not only a loss of human efforts but also great deterioration in yield result. Moreover, when any of the components is out of stock, the system cannot further effected a given function without a revised program. Accordingly, the yield of the product is affected considerably.

SUMMARY OF THE INVENTION

Accordingly, an object of the present invention is to provide a method for controlling a different component inserting system by which feeder selection switches are turned ON or OFF to determine an insertion of the components when the feeder is out of stock or the yield of the product is affected due to bad components, whereby preventing a loss of human efforts and improving an efficiency of production.

In order to achieve the object, the present invention contemplates a method of controlling a different component inserting system. The method includes the steps of turning ON a power voltage to initialize the system; reading out whether a feeder is selected by pressing a start switch and then storing chuck and insertion determination data into a memory; and correctly positioning a printed circuit board on a conveyor and determining whether the insertion of the components must be carried out at a first point on the PCB substrate. Next a hand and clinch moves to a component chucking position when the insertion from the first point is determined at the component insertion determination step. Then the component is inserted after position control when the hand and clinch have been completely moved to the component insertion position during the move step. The PCB substrate passes to a next stage when the insertion of the components is completed at the component insertion step or when remaining insertion points are not present, and a 1-cycle completion signal is generated to initialize a peripheral apparatus to effect the component insertion control repeatedly.

The above objects, features and advantages of the present invention will be apparent from the following description taken with reference to the accompanying drawings.

DETAILED DESCRIPTION OF THE INVENTION

Hereinafter, a preferred embodiment of the present invention will be described in detail.

Figure 1:
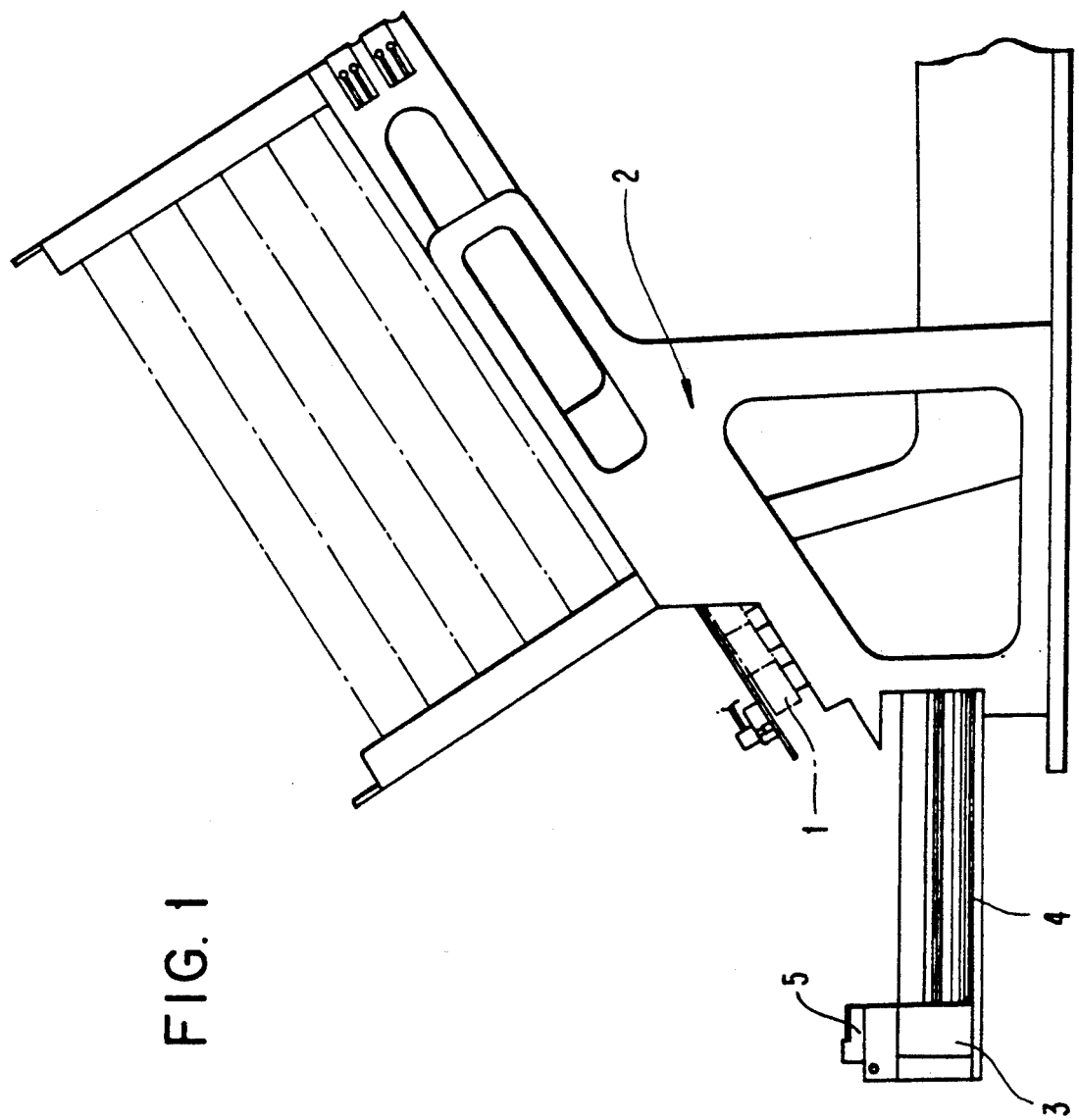
FIG. 1 is a schematic view of an electronic component inserting system.
Figure 2:
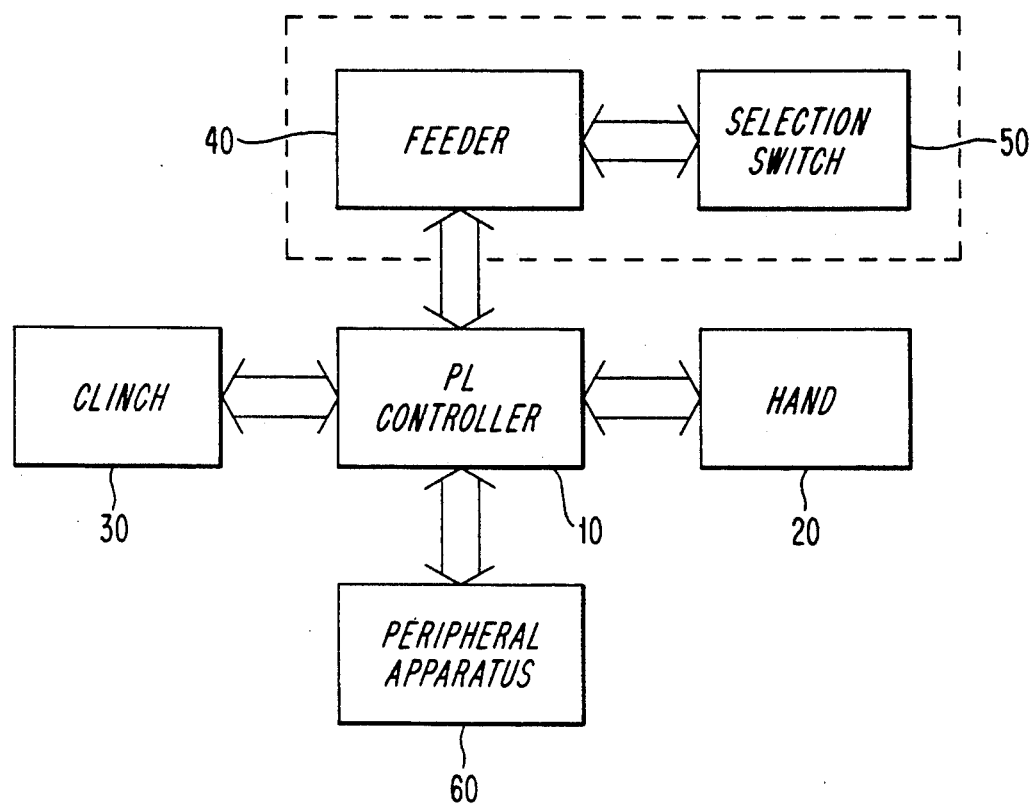
FIG. 2 is a block diagram of a different component inserting system according to the present invention.
Figure 3:
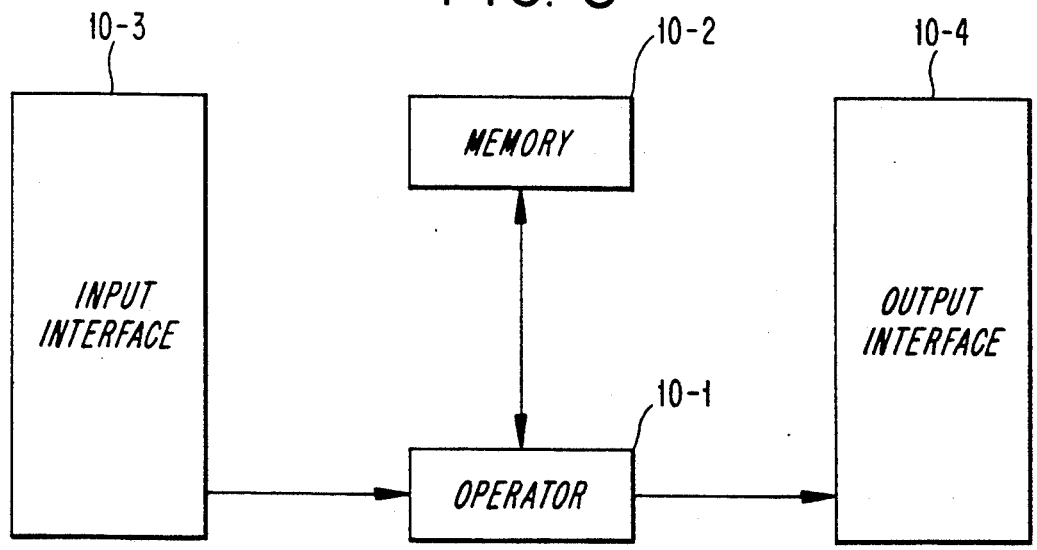
FIG. 3 is a basic construction view of a programmable logic controller in FIG. 2.

Referring to FIGS. 2 and 3, a programmable logic controller 10, which is referred to as a PL controller, entirely controlling the different component inserting system and a peripheral apparatus. The PL controller 10 comprises an operation portion 10-1 for analyzing and performing a program, and a memory 10-2 for receiving the program outputted form the operation portion 10-1. Also, included in the controller 10 is an input interface 10-3 for receiving the output signal of a selection switch portion 50 which determines a selection of a feeder 40, and an output interface 10-4 for outputting the control signal to the feeder, hand 20, clinch 30 and peripheral apparatus 60. The peripheral apparatus 60 includes a programming panel directly connected to the PL controller 10 for scheduling and monitoring the program, a graphic programing panel for scheduling, monitoring and performing a program, a ROM writer for writing the program from a ROM to RAM or from RAM to ROM, an audio cassette for recording the program onto a magnetic tape, and a printer for confirming the program content easily by scheduling a circuit diagram and program lists.

The hand 20 is moved to the component chucking position to properly chuck the component 1. That is, when the hand 20 is moved together with the clinch 30 and controlled in position, the component 1 can be inserted. The feeder 40 feeds the components 1 to be inserted, and the selection switch portion 50 is turned ON or OFF to determine the selection of the feeder in order to control the insertion of the component.

With the control arrangement of the component inserting system according to the present invention, the feeder 40 is operated to feed the component 1 to be inserted in accordance with the selection of the selection switch portion 50 under control of the PL controller 10 assisted by the peripheral apparatus 60. Then the hand 20 and clinch 30 chuck the component 1 fed by the feeder 40 in order to carry out an adequate component inserting operation.

Figure 4:
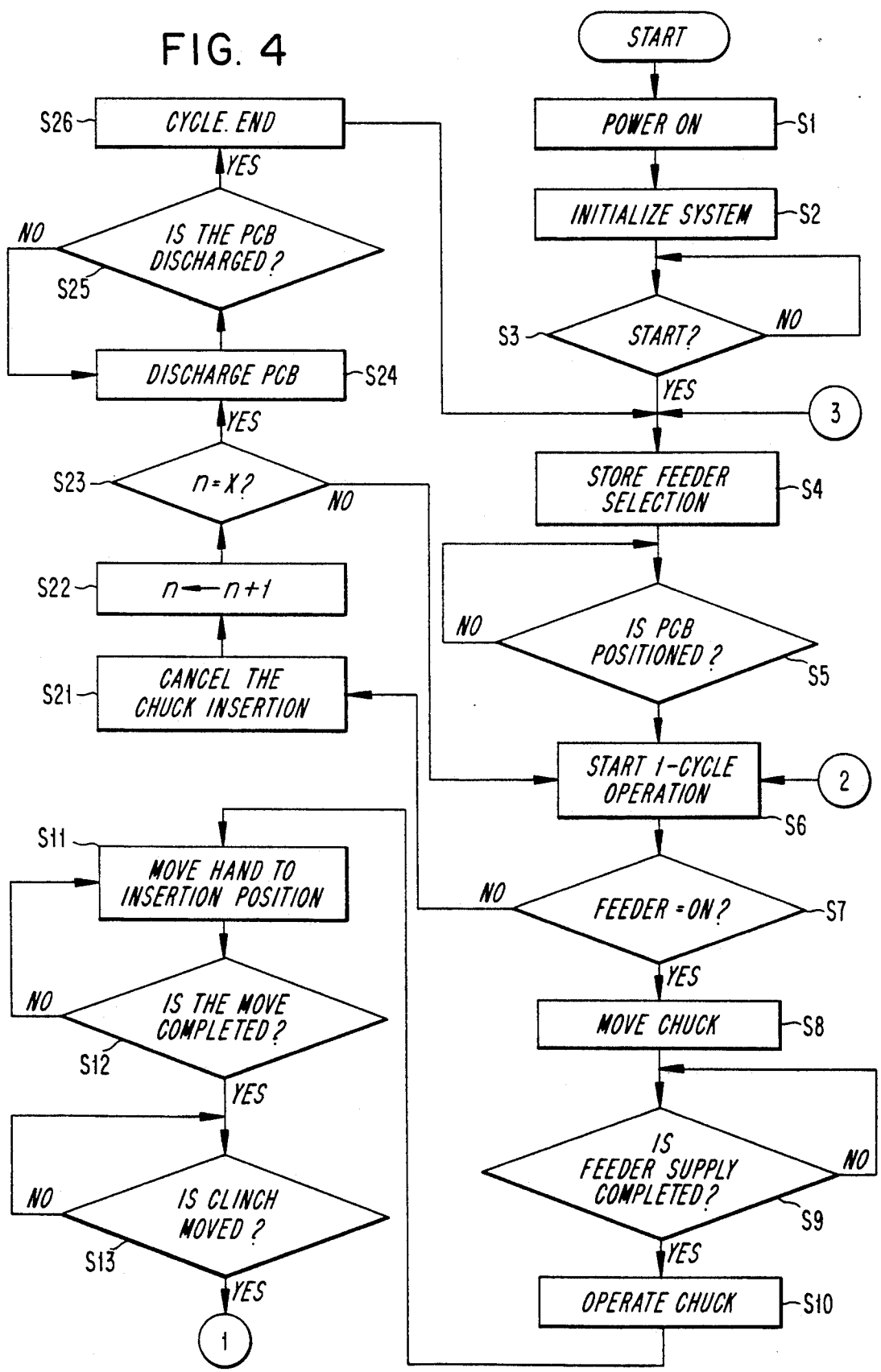
FIG. 4 is a flowchart illustrating an operational sequence of the present invention.
Figure 5:
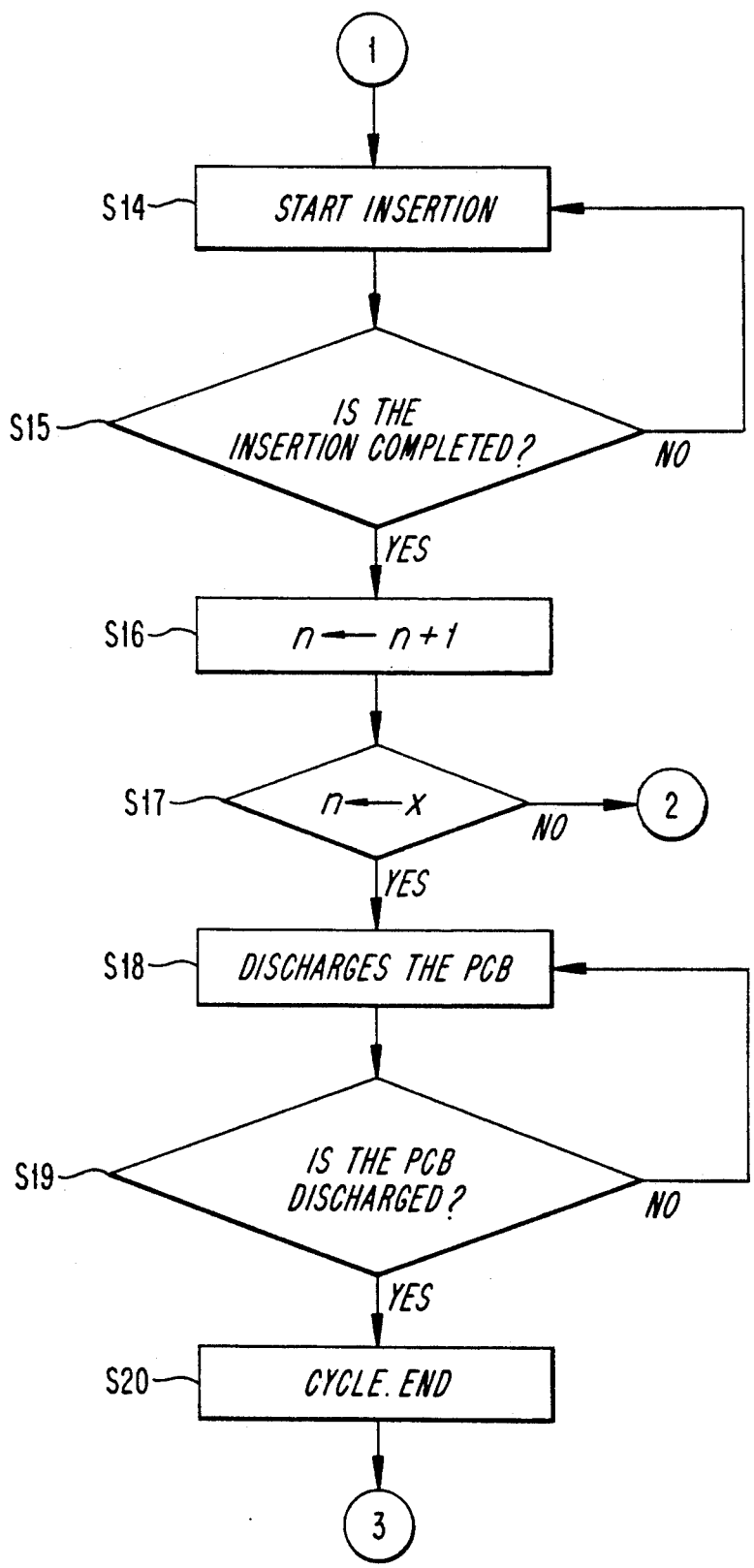
FIG. 5 is a flowchart illustrating an operational sequence continuing of the sequence illustrated in FIG. 4.

Now, the description will be made in connection with the component insertion control method illustrated in the flowchart of FIG. 4.

When the power voltage is supplied to the component inserting system at a step S1, the system is initialized and the program, in which the number n of the component insertion point and the number of the component to be inserted are previously set, is selected by way of a digital switch for model selection (That is, model for any one of several PCB substrates), at a step S2. Next, at a step S3, it is determined whether the start switch has been pressed. If the switch is pressed, that is YES, then at a step S4 it is determined that a feeder 40 of the feeders is selected depending on the program stored in the PL controller 10, and the chuck and insertion data for chucking and inserting the component 1 which is loaded in feeder 40 are stored in the memory 10-2 of the PL controller 10, at step S4. Subsequently, at a step S5 it is determined whether the PCB substrate is accurately positioned on a conveyor (not shown). As a result, if Yes, then at a step S6 the selection information and data previously stored by the robot program are read out from the PL controller 10 to start a 1-cycle component inserting operation.

Meanwhile, if the start switch is not pressed at the step S3, then the operations which follow step S3 are repeatedly uneffected, and if the PCB substrate is incorrectly positioned, then the operations following step S5 are repeatedly uneffected. In this case, an alarm signal is sounded to inform such states to the user.

Consequently, the control proceeds to a step S7 at which it is determined whether the feeder 40 is ON, based on whether the component is bad. As a result, if the feeder 40 is ON, the control sequence proceeds to a step S8 at which the chuck 30 is moved to the component chucking position by the hand 20, and at a step S9 it is determined whether the components 1 to be inserted have all been supplied by the feeder 40. If the supply of the component 1 is completed control proceeds to a step S10. Alternatively, if the supply of the component is not completed, then the operation returns to the step S9.

At the step S10, the component 1 is chucked and then control proceeds to a step S11, at which the hand 20 is moved to the component inserting position on the PCB substrate. The control proceeds to a step S12, at which it is determined whether the hand 20 is moved to component inserting position. If the hand has moved, if YES then control proceeds to the step S13 to determine whether the clinch 30 has moved to the component inserting position. At the step 13, when the move of the clinch 30 is completed, that is Yes, control advances to a step S14 and the components 1 are inserted to the PCB substrate at that step.

Next, at a step S15, it is determined whether the component inserting operation is completed. If the operation is completed, that is Yes, then the control proceeds to a step S16, at which the number n of the component previously initialized and set at the step S2 is added by 1, and the control is preceded to a step S17.

At the step S17, it is determined whether the number n of the component to be inserted is equal to the number of insertion points. If the numbers are equal to each other, this means that the components have been inserted to the PCB substrate. Consequently, control proceeds to a step S18 at which the PCB substrate is discharged. On the contrary, if the numbers are not equal to each other, then control returns to the step S6 in order to repeatedly effect the operations which follow step S6.

Meanwhile, at the step S19, it is determined whether the discharge of the PCB substrate has been completed. If the discharge is completed, that is Yes, then at a step S20 1-cycle is completed and the completion alarm sound is generated. Subsequently, control returns to the step S4 to insert the components 1 to a next PCB substrate based on the sequence described above.

More specifically, if the PCB substrate is supplied from the front side thereof and then accurately positioned at the working area of the robot system on the conveyor, control returns to the step S4 to repeatedly effect the sequence as described above. At this time, PL controller 10 stores data related to ON or OFF of the feeder selection switches on the basis of the program stored therein in order to effect a work suitable to the information obtained by the chuck of the variation in ON/OFF of the feeder selection switches.

That is, the ON/OFF of the feeder selection switches is determined after the completion of 1- cycle in order to control the insertion of the specified components 1 by the feeder selection switches when the components 1 are out of stock or when a bad component must be removed.

At the step S19, if the PCB substrate is not discharged, control returns to the step S18 to effect the operation that follows that step.

If the feeder 40 is not ON at step S7, that is, NO, then control proceeds to a step S21 to cancel the component chucking and inserting operation and the number n of the component previously initialized and set at the step 2, is increased by 1. Then, control proceeds to a step S23 to determine whether the number n of the components 1 to be inserted and the number X of the inserting point are equal to each other. If the numbers are different, then control returns to the step S6 in order to carry out the operations following step S6. Alternatively, if the numbers are equal to each other, then control proceeds to the step S25 and, consequently, it is determined whether the discharge of the PCB substrate is completed. As a result, if the PCB substrate is not discharged, then control returns to effect the operations following step S24. On the contrary, if the discharge of the PCB substrate has been completed at the step S25, then control proceeds to the step S26 to complete the 1-cycle operation and control returns to effect the operations that follow step S4.

Meanwhile, according to the present invention it should be noticed that several model programs restricted with one model program may be considered for the different component inserting system as described below.

The description will be made assuming that four kinds of components, for example, A, B, C and D are inserted to the different component inserting robot model 1.

(1) When the component A is very bad, it is preferable to improve the quality of the component A. But, when the improvement in quality of the component A is impossible, the switch for selecting the feeder feeding the component A is turned OFF with respect to the remaining components B, C and D excluding the component A.

(2) If the component C is out of stock, then the feeder selecting switch is turned OFF and the remaining components A, B and D are inserted tot he PCB substrate without waiting for supply of the component B.

(3) If the robot model 2 is employed to insert the components A, B and C, then the program embodied in the robot model 1 can be applied to the robot model 2. More specifically, if the feeder switch for supplying the component B is turned OFF under a program of the robot model 1, it can be used as a novel program for inserting the components A, C and D excluding the component B.

As described above, according to the method for controlling the different component inserting system, the insertion of the components is decided by turning ON or OFF the feeder selecting switches. As a result, the loss in man power can be reduced remarkably and the yield of the product can be improved. In addition, the component insertion program can be employed to several robot models, so waiting time for supplying the parts is reduced even if the model is changed out of necessity.

What is claimed is:

1. A method of controlling a component inserting system for inserting components into a printed circuit substrate, said method comprising the steps of:
    setting, in a programmable logic controller, a program having a first variable for identifying a component insertion point and a second variable for identifying a component to be inserted;
    providing at least two component feeders;
    selecting a component feeder from said at least two component feeders based on said program;
    storing chuck data and insertion data of the selected component feeder in said programmable logic controller;
    positioning a printed circuit substrate on a conveyor at a substrate position;
    judging whether the selected feeder is operative depending on the condition of a component to be fed by the selected feeder;
    moving a chuck to a component chucking position with a hand mechanism connected to said programmable logic controller based on said chuck data of said selected feeder when the selected feeder is judged to be operative in said judging step;
    determining whether the selected feeder is operative depending on whether components can be fed by the selected feeder;
    supplying at least one component to said chuck from said selected feeder at said component chucking position when the selected feeder is determined to be operative in said determining step;
    moving said hand and a clinch to a component insertion position on said printed circuit substrate based on said insertion data;
    inserting said at least one component into said printed circuit substrate; and
    discharging said printed circuit substrate from said substrate position after said at least one component has been inserted into said printed circuit substrate.

2. The method of claim 1 further comprising the steps of:
    incrementing the second variable when said feeder is not operative; and
    determining whether said first variable and said second variable correspond to one another.

3. The method of claim 2, further comprising the step of discharging the printed circuit board when said first variable corresponds to the second variable.

4. The method of claim 2, further comprising the step of returning to said judging step when said first variable does not correspond to the second variable.

* * * * *